United States Patent
Yeo et al.

(10) Patent No.: US 10,425,049 B2
(45) Date of Patent: Sep. 24, 2019

(54) WIRELESS ELECTRIC POWER TRANSMITTER

(71) Applicants: Samsung Electronics Co., Ltd., Gyeonggi-do (KR); Korea Advanced Institute of Science and Technology, Daejeon (KR)

(72) Inventors: Sung-Ku Yeo, Daejeon (KR); Song-Cheol Hong, Daejeon (KR); Duk-Ju Ahn, Seoul (KR); Gwang-Hyeon Jeong, Busan (KR); Se-Ho Park, Gyeonggi-do (KR); Min-Cheol Ha, Gyeonggi-do (KR)

(73) Assignees: Samsung Electronics Co., Ltd (KR); Korea Advanced Institute of Science and Technology (KR)

( * ) Notice: Subject to any disclaimer, the term of this patent is extended or adjusted under 35 U.S.C. 154(b) by 392 days.

(21) Appl. No.: 14/162,340

(22) Filed: Jan. 23, 2014

(65) Prior Publication Data

US 2014/0203772 A1   Jul. 24, 2014

(30) Foreign Application Priority Data

Jan. 23, 2013   (KR) .................. 10-2013-0007219

(51) Int. Cl.
*H02J 7/00* (2006.01)
*H03F 3/217* (2006.01)
(Continued)

(52) U.S. Cl.
CPC ............ *H03F 3/2171* (2013.01); *H02J 5/005* (2013.01); *H02J 17/00* (2013.01); *H02J 50/12* (2016.02); *H02J 50/40* (2016.02); *H03F 3/2176* (2013.01)

(58) Field of Classification Search
CPC ............ H02J 50/12; H02J 50/40; H02J 5/005
(Continued)

(56) References Cited

U.S. PATENT DOCUMENTS 6,285,251 B1 * 9/2001 Dent et al. .................... 330/127
8,432,070 B2 * 4/2013 Cook et al. ................... 307/150
(Continued)

FOREIGN PATENT DOCUMENTS

KR   1020080098645   11/2008
KR   1020110112435   10/2011
(Continued)

OTHER PUBLICATIONS

Korean Office Action dated Feb. 8, 2019 issued in counterpart application No. 10-2013-0007219, 7 pages.
(Continued)

*Primary Examiner* — Suchin Parihar
(74) *Attorney, Agent, or Firm* — The Farrell Law Firm, P.C.

(57) ABSTRACT

A wireless electric power transmitter for transmitting electric power for a charging function to a wireless electric power receiver is provided. The wireless electric power transmitter includes an electric power supply unit which supplies electric power; an amplifier which amplifies and outputs the electric power supplied from the electric power supply unit by a preset gain as a magnitude of measured impedance increases; and a transmitter which transmits the amplified electric power to the wireless electric power receiver.

7 Claims, 7 Drawing Sheets

(51) Int. Cl.
  *H02J 50/40* (2016.01)
  *H02J 50/12* (2016.01)
  *H02J 5/00* (2016.01)
  *H02J 17/00* (2006.01)
(58) Field of Classification Search
  USPC .......................................................... 320/108
  See application file for complete search history.

(56) References Cited

U.S. PATENT DOCUMENTS

| | | | |
|---|---|---|---|
| 9,083,282 B2* | 7/2015 | Zhang et al. | |
| 2007/0129029 A1* | 6/2007 | Litmanen ...................... | 455/126 |
| 2009/0184765 A1 | 7/2009 | Chaoui | |
| 2010/0110741 A1* | 5/2010 | Lin et al. ...................... | 363/127 |
| 2010/0217553 A1 | 8/2010 | Von Novak et al. | |
| 2010/0277003 A1 | 11/2010 | Von Novak et al. | |
| 2012/0126888 A1 | 5/2012 | Ikriannikov et al. | |
| 2013/0038136 A1* | 2/2013 | Wheatley et al. ............. | 307/104 |
| 2013/0082538 A1* | 4/2013 | Wambsganss et al. ....... | 307/104 |
| 2013/0088088 A1* | 4/2013 | Wambsganss .......... | H02J 5/005 |
| | | | 307/104 |
| 2013/0116017 A1* | 5/2013 | Zhang et al. .............. | 455/575.7 |
| 2014/0070773 A1* | 3/2014 | Cottrill et al. ................ | 320/150 |
| 2014/0266460 A1* | 9/2014 | Nobbe et al. ................. | 330/295 |

FOREIGN PATENT DOCUMENTS

| | | |
|---|---|---|
| KR | 1020110134912 | 12/2011 |
| KR | 1020120134028 | 12/2012 |

OTHER PUBLICATIONS

Korean Decision of Grant dated Aug. 20, 2019 issued in counterpart application No. 10-2013-0007219, 7 pages.

* cited by examiner

WIRELESS ELECTRIC POWER TRANSMITTER

PRIORITY

This application claims priority under 35 U.S.C. § 119(a) to Korean Patent Application Serial No. 10-2013-0007219, which was filed in the Korean Intellectual Property Office on Jan. 23, 2013, the entire content of which is incorporated herein by reference.

BACKGROUND

1. Field of the Invention

The present invention generally relates to a wireless electric power transmitter, and more particularly to a wireless electric power transmitter for transmitting electric power to a wireless electric power receiver.

2. Description of the Related Art

Mobile terminals such as a mobile phone, a Personal Digital Assistant (PDA) and the like are driven with rechargeable batteries due to their nature, and the battery of the mobile terminal is charged through supplied electric energy by using a separate charging apparatus. In general, a separate contact terminal is arranged outside of the charging apparatus and the battery, and the charging apparatus and the battery are electrically connected to each other through contact between their contact terminals.

However, since the contact terminal outwardly protrudes in such a contact type charging scheme, the contact terminal is easily contaminated by foreign substances and thus the battery charging may not be correctly performed. Further, the battery charging may also not be correctly performed in a case where the contact terminal is exposed to moisture.

Recently, a wireless charging or a non-contact charging technology has been developed and used for electronic devices to solve the above-mentioned problem.

Such a wireless charging technology employs wireless electric power transmission/reception, and corresponds to, for example, a system in which a battery can be automatically charged when a portable phone is not connected to a separate charging apparatus, but merely placed on a charging pad. Accordingly, a waterproof function can be improved since electronic products are wirelessly charged through the wireless charging technology, and the portability of electronic devices can be increased since there is no need to provide a wired charging apparatus.

The wireless charging technology largely includes an electromagnetic induction scheme using a coil, a resonance scheme using a resonance, and an RF/microwave radiation scheme converting electrical energy to microwaves and then transmitting the microwaves.

It is considered up to now that the electromagnetic induction scheme is mainstream, but it is expected that the day will come when all electronic products are wirelessly charged, anytime and anywhere, without a wire in the near future on the strength of recent successful experiments for wirelessly transmitting power to a destination spaced away by dozens of meters through the use of microwaves.

A power transmission method using the electromagnetic induction corresponds to a scheme of transmitting electric power between a first coil and a second coil. When a magnet is moved in the coil, induced current is generated. Accordingly, a transmission side generates a magnetic field by using the induced current and a reception side generates energy through an induced current according to changes in the magnetic field. This phenomenon is referred to as the magnetic induction, and the electric power transmission method using magnetic induction has high energy transmission efficiency.

With respect to the resonance scheme, a wireless charging system employs a concept in physics whereby resonance is the tendency in which when a tuning fork oscillates at a particular frequency, a wine glass next to the tuning fork oscillates at the same frequency. In the resonance scheme an electromagnetic wave containing electrical energy resonates instead of sounds resonating. The resonated electrical energy is directly transferred only when there is a device having a resonance frequency nearby, and parts of electrical energy which are not used are reabsorbed into an electromagnetic field instead of being spread in the air, so that the electrical energy does not affect surrounding machines or people, unlike other electromagnetic waves.

Meanwhile, a conventional wireless electric power transmitter generally includes a class E type amplifier. However, the class E type amplifier has a problem in that it is difficult to maintain an output with a desired magnitude in a circumstance similar to a resonance scheme in which load impedance is changed. Accordingly, the class E type amplifier changes a value of a required device as the load impedance is changed. On the other hand, a class D type amplifier does not change a value of a required device as load resistance is changed. However, since the conventional class D type amplifier has a problem in that output electric power reduces as the load resistance increases, there is a problem in that it is not suitable for use in the wireless electric power transmitter.

SUMMARY

The present invention has been made to solve the above-mentioned problems in the conventional art, and an aspect of the present invention is to provide a wireless electric power transmitter including a class D type amplifier to increase output electric power when load resistance increases.

An aspect of the present invention is to provide, in the case where the load resistance increases, a wireless electric power transmitter including a class D type amplifier which enables the output electric power to increase.

Another aspect of the present invention is to provide a wireless electric power transmitter in which the output electric power can be adjusted under a condition of a specific electric voltage and a load resistance.

Another aspect of the present invention is to provide a wireless electric power transmitter in which the output electric power also increases when the load resistance increases, and when there is no load resistance, can safely stay in a standby state without the electric power output.

In accordance with an aspect of the present invention, a wireless electric power transmitter is provided. The wireless electric power transmitter includes an electric power supply unit which supplies electric power; an amplifier which amplifies and outputs the electric power supplied from the electric power supply unit by a preset gain as a magnitude of measured impedance increases; and a transmitter which transmits the amplified electric power to a wireless electric power receiver.

In accordance with another aspect of the present invention, a class D type amplifier is provided. The class D type amplifier includes an RF choke device which is supplied with electric power from an electric power supply unit; a first node which is connected to one end of the RF choke device; a second node which is connected to another end of the RF choke device; a the load resistor; and an impedance changing and filtering unit which includes a capacitor having one end connected to the first node and another end connected to one end of the second node and the load resistor, and a coil having one end connected to the first node and another end connected to the load resistor.

In accordance with still another aspect of the present invention, a class D type amplifier is provided. The class D type amplifier includes an RF choke device which is connected to an electric power supply unit and is supplied with electric power from the electric power supply unit; a first node which is connected to one end of the RF choke device; a second node which is connected to another end of the RF choke device; a load resistor; and an impedance changing and filtering unit which includes a capacitor having one end connected to the first node and another end connected to one end of the second node and the load resistor, a first coil having one end connected to the first node and another end connected to the load resistor and a second coil having one end connected to the second node and the other end connected to the load resistor.

BRIEF DESCRIPTION OF THE DRAWINGS

The above and other aspects, features, and advantages of the present invention will be more apparent from the following detailed description taken in conjunction with the accompanying drawings, in which.

DETAILED DESCRIPTION OF EMBODIMENTS OF THE PRESENT INVENTION

Figure 1A:
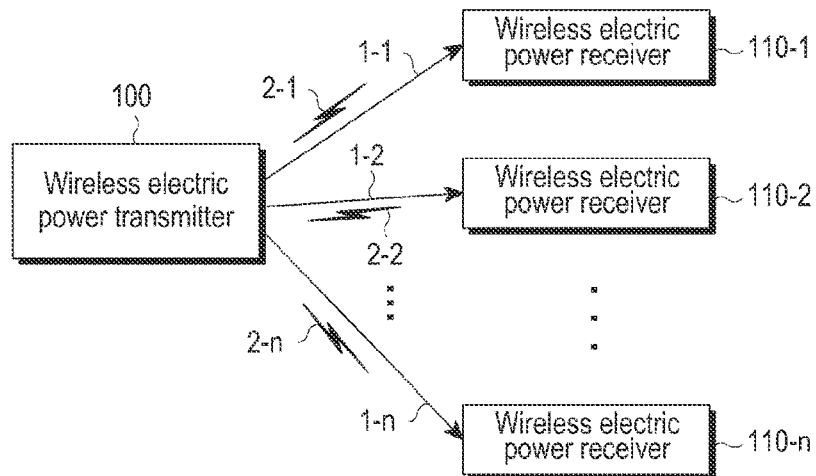
FIG. 1A illustrates an overall operation of a wireless charging system.

Hereinafter, various embodiments of the present invention will be described more specifically with reference to the accompanying drawings. It should be noted that the same components of the drawings are designated by the same reference numeral throughout the description. In the following description of the present invention, a detailed description of known functions and configurations incorporated herein will be omitted when it may make the subject matter of the present invention unclear.

FIG. 1 illustrates an overall operation of a wireless charging system. As shown in FIG. 1A, a wireless charging system includes a wireless electric power transmitter 100 and one or more wireless electric power receivers 110-1, 110-2, . . . , and 110-n.

The wireless electric power transmitter 100 may wirelessly transmit electric power 1-1, 1-2, . . . , and 1-n to the one or more wireless electric power receivers 110-1, 110-2, . . . , and 110-n, respectively. More particularly, the wireless electric power transmitter 100 may wirelessly transmit the electric power 1-1, 1-2, . . . , and 1-n only to an authorized wireless electric power receiver having passed through a predetermined authorization procedure.

The wireless electric power transmitter 100 achieves an electrical connection with the wireless electric power receivers 110-1, 110-2, . . . , and 110-n. For example, the wireless electric power transmitter 100 wirelessly transmits electric power in an electromagnetic wave type to the wireless electric power receivers 110-1, 110-2, . . . , and 110-n.

Meanwhile, the wireless electric power transmitter 100 may perform bidirectional communication with the wireless electric power receivers 110-1, 110-2, . . . , and 110-n. Here, the wireless electric power transmitter 100 and the wireless electric power receivers 110-1, 110-2, . . . , and 110-n processes or transmits/receives packets 2-1, 2-2, . . . , and 2-n including predetermined frames. The frames will be described below in more detail. Particularly, the wireless electric power receiver may be a mobile communication terminal, a PDA, a PMP, a smart phone or the like.

The wireless electric power transmitter 100 wirelessly provides electric power to a plurality of wireless electric power receivers 110-1, 110-2, . . . , and 110-n. For example, the wireless electric power transmitter 100 may transmit electric power to the plurality of wireless electric power receivers 110-1, 110-2, . . . , and 110-n through a resonance scheme. When the wireless electric power transmitter 100 adopts the resonance scheme, it is preferable that a distance between the wireless electric power transmitter 100 and the plurality of wireless electric power receivers 110-1, 110-2, . . . , and 110-n is equal to or shorter than 30 m. Further, when the wireless electric power transmitter 100 adopts the electromagnetic induction scheme, it is preferable that a distance between the wireless electric power transmitter 100 and the plurality of wireless electric power receivers 110-1, 110-2, . . . , and 110-n is equal to or shorter than 10 cm.

The wireless electric power receivers 110-1, 110-2, . . . , and 110-n receives wireless electric power from the wireless electric power transmitter 100 to charge batteries therein. Further, the wireless electric power receivers 110-1, 110-2, . . . , and 110-*n* transmit a signal requesting wireless electric power transmission, information required for wireless electric power reception, state information of the wireless electric power receiver, or control information of the wireless electric power transmitter 100 to the wireless electric power transmitter 100. Information on the transmission signal will be described below in more detail.

Further, the wireless power receivers 110-1, 110-2, . . . , and **110-*n* may transmit a message indicating a charging state of each of the wireless electric power receivers 110-1, 110-2, . . . , and 110-*n* to the wireless power transmitter 100**.

The wireless electric power transmitter 100 may include a display means such as a display, and displays a state of each of the wireless electric power receivers 110-1, 110-2, and **110-*n* based on the message received from each of the wireless electric power receivers 110-1, 110-2, . . . , and 110-*n*. Further, the wireless electric power transmitter 100 may also display a time expected to be spent until each of the wireless electric power receivers 110-1, 110-2, . . . , and 110-*n*** is completely charged.

The wireless electric power transmitter 100 transmits a control signal to disable a wireless charging function to each of the wireless electric power receivers 110-1, 110-2, . . . , and **110-*n*. The wireless electric power receivers having received the disable control signal of the wireless charging function from the wireless electric power transmitter 100** disable the wireless charging function.

Figure 1B:
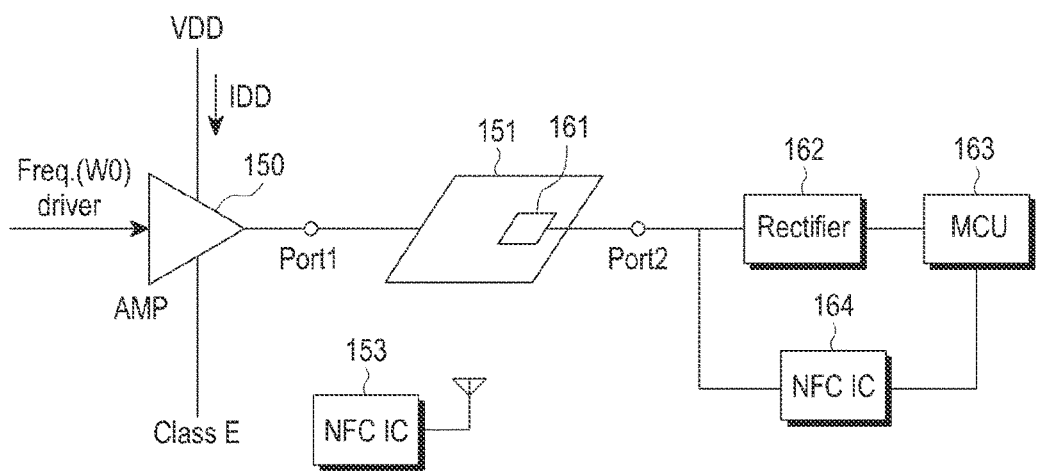
FIG. 1B illustrates an example of a wireless electric power receiver and a wireless electric power transmitter according to an embodiment of the present invention.

FIG. 1B illustrates an example of a wireless electric power receiver and a wireless electric power transmitter according to an embodiment of the present invention. As shown in FIG. 1B, the wireless electric power transmitter includes an amplifier 150, a loop coil 151 and an integrated circuit 153 for a short-range communication. The amplifier 150 receives an input of electromagnetic waves with a frequency of w₀ induced from a frequency driver. In addition, the amplifier 150 receives an input of driving current of I$_{DD}$ by a driving voltage of V$_{DD}$, and may be implemented as a class D type amplifier. The loop coil 151 oscillates a preset electromagnetic wave based on a signal input from the amplifier 150. Meanwhile, the integrated circuit 153 for the short-range communication transmits and receives a communication signal based on a desired scheme. Here, a frequency of the wireless electric power may be identical to or different from a frequency of a communication signal. Meanwhile, the amplifier 150, as described in more detail below, outputs electric power, a value of which is increased as a load resistance in view of the amplifier 150 increases. Therefore, when the number of the wireless electric receivers receiving electric power for a charging function increases, the electric power output from the amplifier 150 increases. The wireless electric power transmitter may further include an electric power supply unit (not shown) for supplying the amplifier 150 with electric power. On the other hand, the loop coil 151 may be referred to as an electric power transmission unit in consideration of the transmission of electric power.

Meanwhile, the wireless electric power receiver includes a loop coil 161, a rectifier 162, a control unit 163, and an integrated circuit 164 for short-range communication. The loop coil 161 receives wireless electric power from the loop coil 151, and also receives a communication signal from the integrated circuit 153 for the short-range communication. The wireless electric power receiver according to the present invention outputs the wireless electric power to the rectifier 162, and the communication signal to the integrated circuit 164 for the short-range communication, through a port 2 thereof. The control unit 163 controls overall operations of the wireless electric power receiver, and also generates a corresponding communication signal based on the communication signal from the integrated circuit 164 for the short-range communication.

Figure 2:
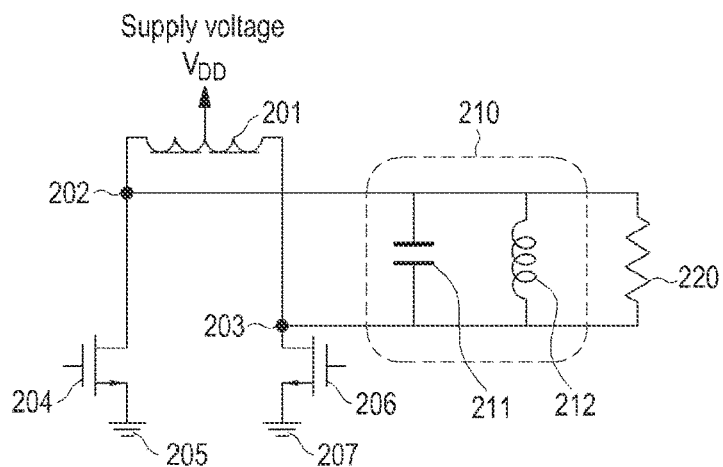
FIG. 2 is a circuit diagram illustrating a class D type amplifier according to a comparison example with the present invention.

FIG. 2 is a circuit diagram illustrating a class D type amplifier according to an example to be compared with the present disclosure.

As shown in FIG. 2, the class D type amplifier according to the compared example includes an RF choke 201, a first node 202, a second node 203, a first switch transistor 204, a ground 205, a second switch transistor 206, a ground 207, a filter unit 210 and a load resistor 220. Further, the filter unit 210 includes a capacitor 211 and a coil 212 which are connected to each other in parallel. The RF choke 201 receives electric power with an electric voltage of V$_{DD}$.

A value of the output electric power in the class D type amplifier according to the comparison example is determined by Equation (1).

$$P_{OUT} = \frac{\pi^2}{2} \frac{V_{DD}^2}{R_L} \tag{1}$$

In Equation (1), P$_{out}$ is the output electric power, and R$_L$ is a resistance value of the load resistor 220. When the number of the wireless electric power receivers receiving the electric power for the charge increases, R$_L$ also may increases. As shown in Equation (1), the output electric power is in an inverse proportion to the R$_L$. Therefore, there is a problem in that the increase of the number of the wireless electric power receivers causes the output electric power to be reduced. Further, there is another problem in that the value of the output electric power determined through Equation (1) is fixed.

Figure 3A:
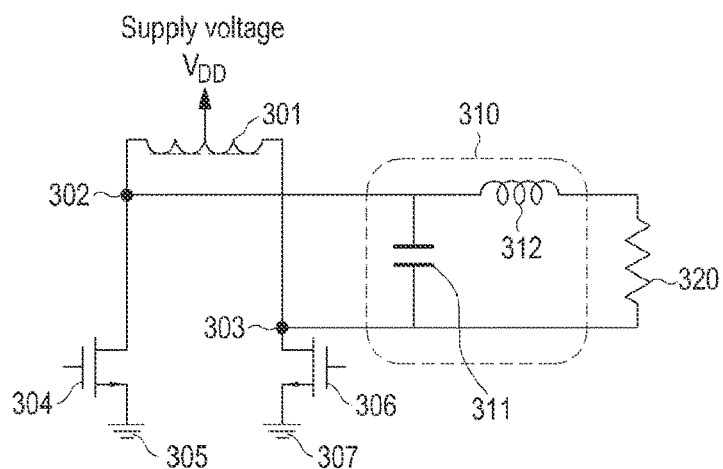
FIG. 3A is a circuit diagram illustrating a class D type amplifier according to an embodiment of the present disclosure.

FIG. 3A is a circuit diagram illustrating the class D type amplifier according to an embodiment of the present invention.

As shown in FIG. 3A, the class D type amplifier according to the embodiment of the present invention includes an RF choke 301, a first node 302, a second node 303, a first switch transistor 304, a ground 305, a second switch transistor 306, a ground 307, an impedance changing and filtering unit 310 and a load resistor 320. Further, the impedance changing and filtering unit 310 includes a capacitor 311 and a coil 312. The RF choke 201 receives electric power with an electric voltage of V$_{DD}$.

The RF choke 301 may be connected to the electric power supply unit (not shown), and may be supplied with electric power with an electric voltage of V$_{DD}$. The RF choke 301 includes at least one coil, and removes an RF noise. The RF choke 301 is connected to the first node 302 and the second node 303.

The first switch transistor 304 and the impedance changing and filtering unit 310 are connected to the first node 302, and the second switch transistor 306 and the impedance changing and filtering unit 310 is connected to the second node 303. The first switch transistor 304 is connected to the ground 305, and the second switch transistor 306 is connected to the ground 307. More particularly, one end of the capacitor 311 and one end of the coil 312 are connected to the first node 302. The end of the capacitor 311 is connected to one end of the coil 312. The other end of the capacitor 311 and the other end of the load resistor 320 are connected to the second node 303. The other end of the coil 312 is connected to the other end of the load resistor 320, and one end of the load resistor 320 is connected to the other end of the capacitor 311. That is, in the comparison example of FIG. 2, the capacitor 211, the coil 212 and the load resistor 220 are connected to one another in parallel, but in the embodiment of the present disclosure of FIG. 3A, the coil 312 and the resistor 320 are connected in series.

Figure 3B:
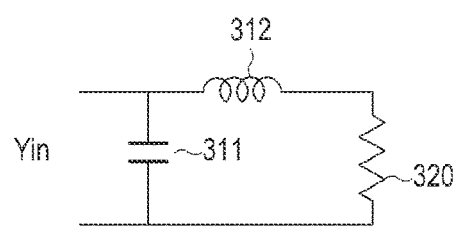
FIG. 3B is a circuit diagram illustrating impedance in view of the first and second nodes of FIG. 3A.

FIG. 3B is a circuit diagram illustrating impedance in view of the first and second nodes of FIG. 3A. As shown in FIG. 3B, the coil 312 and the load resistor 320 are connected in series, and the capacitor 311 is connected to the coil 312 and the load resistor 320 in parallel. The impedance $Y_{in}$ in view of the first and second nodes 302 and 303 may be determined by Equation (2).

$$Yin = \frac{R_L}{R_L^2 + \omega^2 L^2} + j\left(\omega C - \frac{\omega L}{R_L^2 + \omega^2 L^2}\right) \quad (2)$$

In Equation (2), ω is a frequency of supplied electric power, L is an inductance of the coil 312, and C is capacitance of the capacitor 311. On the other hand, the load value $R_{in}$ which is the part of a real number in the impedance $Y_{in}$ can be determined by Equation (3).

$$Rin = R_L\left(1 + \frac{\omega^2 L^2}{R_L^2}\right) \simeq \frac{\omega^2 L^2}{R_L} \quad (3)$$

Accordingly, the output electric power Pout can be determined by Equation (4).

$$P_{OUT} = \frac{\pi^2}{2}\frac{V_{DD}^2}{\omega^2 L^2}R_L \quad (4)$$

As shown in Equation (4), the output electric power of the class D type amplifier according to an embodiment of the present invention is in proportion to the load resistance $R_L$. Therefore, as the number of the wireless electric power receivers for receiving the electric power for the charging function increases, the output electric power also increases. Thereby, it is possible to solve the problem which the comparison example of FIG. 2 has. In addition, the value of the output electric power in Equation (4) may be changed by adjusting the inductance L of the coil. Therefore, there is an advantage in that the value of the output electric power can be easily changed in identical impedance circumstances.

On the other hand, a frequency in which an imaginary number of $Y_{in}$ in FIG. 3 is 0 (zero) may be a resonant frequency. For example, the resonant frequency may be $$\sqrt{\frac{1}{LC} - \frac{R^2}{L^2}}.$$

In the embodiment of the present invention, the resonant frequency may be identical to a switching frequency of a transistor. In this case, a harmonic removal and a zero-voltage switching may be performed. Meanwhile, the resonant frequency may be changed by the value $R_L$ of the load resistance, and device numeral values of the capacitor 311 and the coil 312 may be set considering the value $R_L$ of the load resistance. On the other hand, the resonant frequency of the capacitor 311 and the coil 312 may be set to be higher than the switching frequency of the transistor. A value of a serial quality factor of the coil 312 and load resistor 320 may be set to be larger than 1, so as to desirably perform a harmonic filtering.

As described above, in the case where the load resistance increases, the present invention provides a wireless electric power transmitter including the class D type amplifier which enables the output electric power to increase.

Figure 4A:
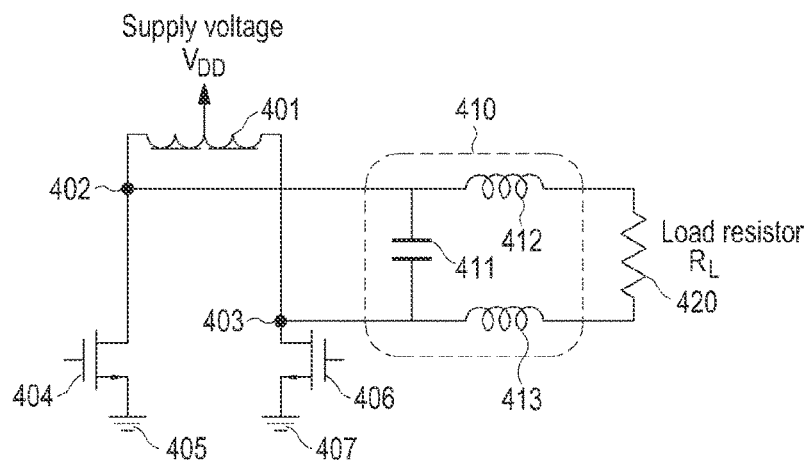
FIG. 4A is a circuit diagram illustrating a class D type amplifier according to an embodiment of the present invention.

FIG. 4A is a circuit diagram illustrating the class D type amplifier according to an embodiment of the present invention.

As shown in FIG. 4A, the class D type amplifier according to an embodiment of the present invention includes an RF choke 401, a first node 402, a second node 403, a first switch transistor 404, a ground 405, a second switch transistor 406, a ground 407, an impedance changing and filtering unit 410 and a load resistor 420. Further, the impedance changing and filtering unit 410 includes a capacitor 411 and a first coil 412. The RF choke 401 receives electric power with an electric voltage of $V_{DD}$.

The RF choke 401 may be connected to the electric power supply unit (not shown), and may be supplied with the electric power with the electric voltage of $V_{DD}$. The RF choke 401 includes at least one coil, and removes an RF noise. The RF choke 401 is connected to the first node 402 and the second node 403.

The first switch transistor 402 and the impedance changing and filtering unit 410 is connected to the first node 402, and the second switch transistor 406 and the impedance changing and filtering unit 410 may be connected to the second node 403. The first switch transistor 404 is connected to the ground 405, and the second switch transistor 406 is connected to the ground 407. More particularly, one end of the capacitor 411 and one end of the first coil 412 is connected to the first node 402. The other end of the capacitor 411 and the other end of the second coil 413 is connected to the second node 403.

Further, one end of the capacitor 411 is connected to one end of the first coil 412. The other end of the first coil 412 is connected to the other end of the load resistor 420, and one end of the load resistor 420 is connected to the other end of the second coil 413. One end of the second coil 413 is connected to the other end of the capacitor 411. That is, the amplifier further includes a second coil 413 in comparison with the amplifier according to the embodiment of FIG. 3A. Accordingly, in the case of using a differential signal, there is an advantage in that symmetry of the differential signal is maintained.

Figure 4B:
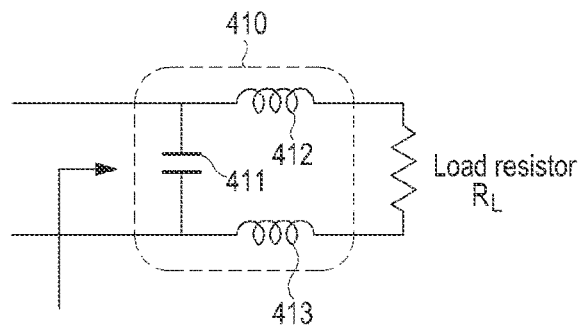
FIG. 4B is a circuit diagram illustrating impedance in view of the first and second nodes of FIG. 4A.

FIG. 4B is a circuit diagram illustrating impedance in view of the first and second nodes of FIG. 4A. As shown in FIG. 4B, the first coil 412, the load resistor 420 and the second coil 413 are connected in series, and the capacitor 411 is connected with the first coil 412, the load resistor 420 and the second coil 413 in parallel. The impedance $Y_{in}$ in view of the first and second nodes 402 and 403 may be determined by Equation (5).

$$Yin = \frac{R_L}{R_L^2 + \omega^2(L_1+L_2)^2} + j\left(\omega C - \frac{\omega(L_1+L_2)}{R_L^2 + \omega^2(L_1+L_2)^2}\right) \quad (5)$$

In Equation (5), ω is a frequency of supplied electric power, $L_1$ is an inductance of a first coil 412, $L_2$ is an inductance of a second coil 413, and C is capacitance of a capacitor 411. On the other hand, the load value $R_{in}$ which is the part of a real number in the impedance $Y_{in}$ can be determined by Equation (6).

$$Rin = R_L \left(1 + \frac{\omega^2(L_1+L_2)^2}{R_L^2}\right) \simeq \frac{\omega^2(L_1+L_2)^2}{R_L} \quad (6)$$

Accordingly, the output electric power Pout can be determined by Equation (7).

$$P_{OUT} = \frac{\pi^2}{2} \frac{V_{DD}^2}{\omega^2(L_1+L_2)^2} R_L \quad (7)$$

As shown in Equation (7), the output electric power of the class D type amplifier according to the embodiment of the present invention is in proportion to the load resistance $R_L$. Therefore, when the number of the wireless electric power receivers for receiving the electric power for a charging function increases, the output electric power also increases.

Figure 5:
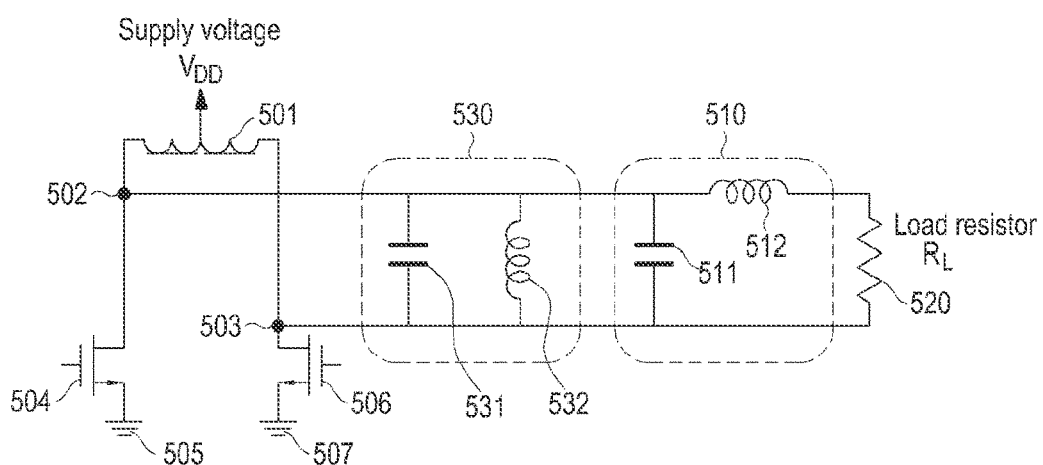
FIG. 5 is a circuit diagram illustrating a class D type amplifier according to another embodiment of the present invention.

FIG. 5 is a circuit diagram illustrating a class D type amplifier according to another embodiment of the present invention.

As shown in FIG. 5, the class D type amplifier according to the embodiment of the present invention includes an RF choke 501, a first node 502, a second node 503, a first switch transistor 504, a ground 505, a second switch transistor 506, a ground 507, an impedance changing and filtering unit 510, a load resistor 520 and a resonant filter 530. The impedance changing and filtering unit 510 includes a first capacitor 511 and a first coil 512. Further, the filter unit 530 includes a second capacitor 531 and a second coil 532 which are connected to each other in parallel. The RF choke 201 receives electric power with an electric voltage of $V_{DD}$.

The RF choke 501 is connected to the electric power supply unit (not shown), and is supplied with electric power with the electric voltage of $V_{DD}$. The RF choke 501 includes at least one coil, and removes an RF noise. The RF choke 501 is connected to the first node 502 and the second node 503.

The first switch transistor 504 and the resonant filter 530 are connected to the first node 502, and the second switch transistor 506 and the resonant filter unit 530 are connected to the second node 503. The first switch transistor 504 is connected to the ground 505, and the second switch transistor 506 is connected to the ground 507. More particularly, one end of a second capacitor 531 and second coil 532 are connected to the first node 502, and the other end of the second capacitor 531 and second coil 532 are connected to the second node 503.

The resonant filter unit 530 is connected to the impedance changing and filtering unit 510. More particularly, the first node 502, the second capacitor 531 and the second coil 532 are connected to one end of the first capacitor 511 and first coil 512. The second node 503, the second capacitor 531 and the second coil 532 are connected to the other end of the capacitor 511 and one end of the load resistor 520. The other end of the first coil 512 is connected to the other end of the load resistor 520. One end of the load resistor 520 is connected to the other end of the first capacitor 511. That is, the amplifier according to the embodiment of the present invention of FIG. 5 further includes a resonant filter 530 in comparison with the amplifier according to the embodiment of FIG. 3A. The resonant filter 530 may be designed to resonate with a switching frequency of a transistor, and may have a value of a high quality factor in order to reduce a loss. On the other hand, it is understood by those skilled in the art that a resonant filter 530 may be additionally included in the embodiment of FIG. 4A as well as in the embodiment of FIG. 3A.

Figure 6A:
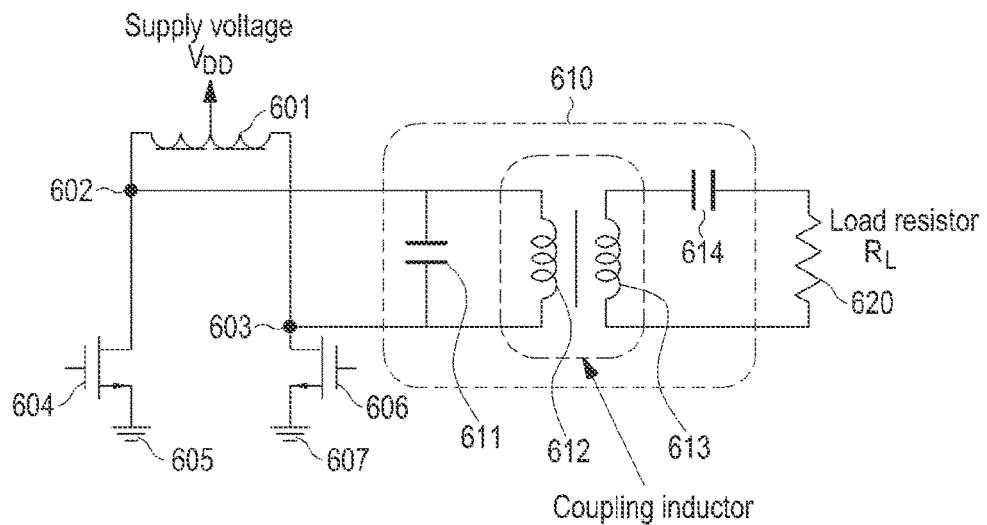
FIG. 6A is a circuit diagram illustrating a class D type amplifier according to an embodiment of the present invention.

FIG. 6A is a circuit diagram illustrating the class D type amplifier according to the embodiment of the present invention.

As shown in FIG. 6A, the class D type amplifier according to the embodiment of the present invention includes an RF choke 601, a first node 602, a second node 603, a first switch transistor 604, a ground 605, a second switch transistor 606, a ground 607, an impedance changing and filtering unit 610 and a load resistor 620. Further, the impedance changing and filtering unit 610 includes a first capacitor 611, a first coil 612, a second coil 613 and a second capacitor 614. The first coil 612 and the second coil 613 are coupled with each other. The RF choke 601 receives electric power with an electric voltage of $V_{DD}$.

The RF choke 601 is connected to the electric power supply unit (not shown), and is supplied with electric power with the electric voltage of $V_{DD}$. The RF choke 601 includes at least one coil, and removes an RF noise. The RF choke 601 is connected to the first node 602 and the second node 603.

The first switch transistor 604 and the impedance changing and filtering unit 610 is connected to the first node 602, and the second switch transistor 606 and the impedance changing and filtering unit 610 is connected to the second node 603. The first switch transistor 604 is connected to the ground 605, and the second switch transistor 606 is connected to the ground 607.

More particularly, one end of the capacitor 611 and one end of the coil 612 are connected to the first node 602. The other end of the capacitor 611 and the other end of the load resistor 612 are connected to the second node 603. The first coil 612 and the second coil 613 are coupled with each other. One end of the second coil 613 is connected to the other end of the capacitor 614. The other end of the first coil 613 is connected to the other end of the load resistor 620. The other end of the second capacitor 614 is connected to the other end of the load resistor 620.

Figure 6B:
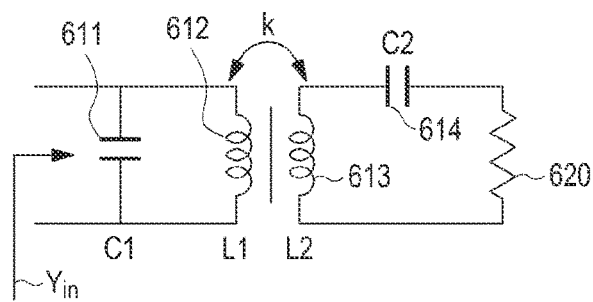
FIG. 6B is a circuit diagram illustrating impedance in view of the first and second nodes of FIG. 6A.

FIG. 6B is a circuit diagram illustrating impedance in view of the first and second nodes of FIG. 6B. As shown in FIG. 6B, the first capacitor 611 and the first coil 612 are connected in parallel, and the second coil 613, the second capacitor 614 and the load resistor 620 are connected in series. The first coil 612 and the second coil 613 are inductively coupled with each other with an inductive constant k. Herein, the mutual inductive coupling may be implemented by a magnetic core or an air core. In addition, the inductive constant k may be at least 0.5, and make an efficiency of 90%. Capacitance of the first capacitor 611 is $C_1$, an inductance of the first coil 612 is $L_1$, an inductance of the second coil 613 is $L_2$, and capacitance of the second capacitor 614 is $C_2$.

A resonant frequency of the filter may be identical to a switching frequency of the transistor. The resonant frequency $\omega_0$ may be $$\frac{1}{L_1 C_1} = \frac{1}{L_2 C_2}.$$

However, the resonant frequency $\omega_{filter}$ may be $$\frac{\omega_0}{\sqrt{1+k}}$$

by the mutual inductive coupling efficiency k. In the case where the resonant frequency $\omega_{filter}$ is identical to the switching frequency of the transistor, a zero-voltage switching may be achieved. In this case, the impedance $Y_{in}$ in view of the first and second nodes 602 and 603 may be determined by Equation (8).

$$Yin = \frac{C_1 R_L}{L_2} \qquad (8)$$

Accordingly, the output electric voltage may be changed by adjusting $C_1$ and $L_2$.

Figure 7:
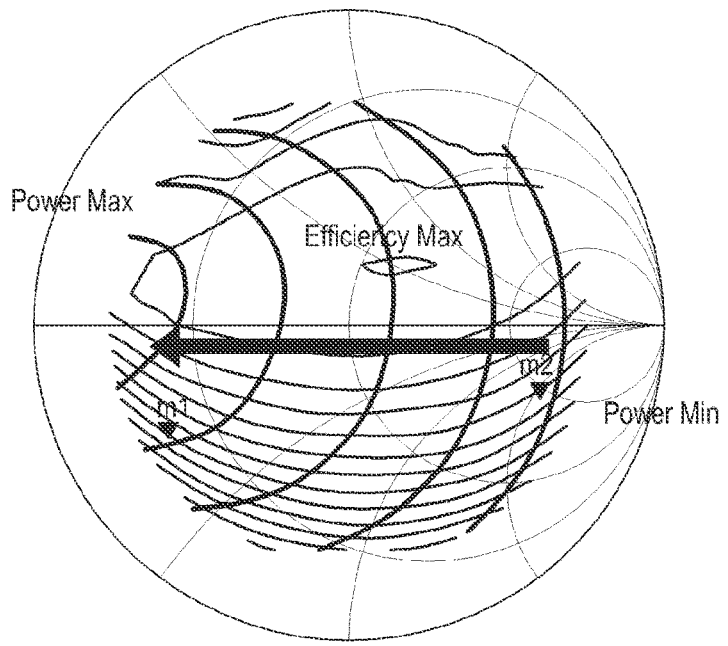
FIG. 7 illustrates a result of a load-pull simulation for output electric power and efficiency which was performed as a load resistance in a class D type amplifier is changed according to the comparison example in FIG. 2.

FIG. 7 illustrates a result of a load-pull simulation for output electric power and efficiency which was performed as a load resistance in the class D type amplifier is changed, according to the comparison example in FIG. 2. As shown in FIG. 7, when the load resistance is relatively small, the value of the output electric power increases. In addition, when the load resistance is relatively large, the value of the output electric power decreases. That is, when the number of the wireless electric power receivers for receiving the electric power for the charge increases, the output electric power decreases.

Figure 8:
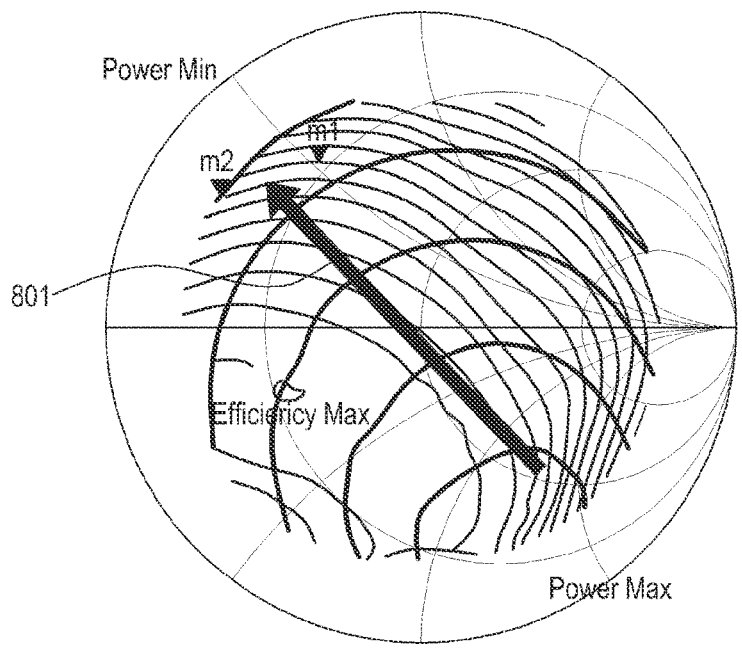
FIG. 8 illustrates a result of a load-pull simulation for output electric power and efficiency which was performed as a load resistance in a class D type amplifier is changed, according to the embodiment of the present disclosure in FIG. 3A.

FIG. 8 illustrates a result of a load-pull simulation for output electric power and efficiency which was performed as a load resistance in the class D type amplifier is changed, according to an embodiment of the present invention in FIG. 3A. As shown in FIG. 8, it is identified that the value of the output electric power decreases when the load resistance is relatively small.

Figure 9:
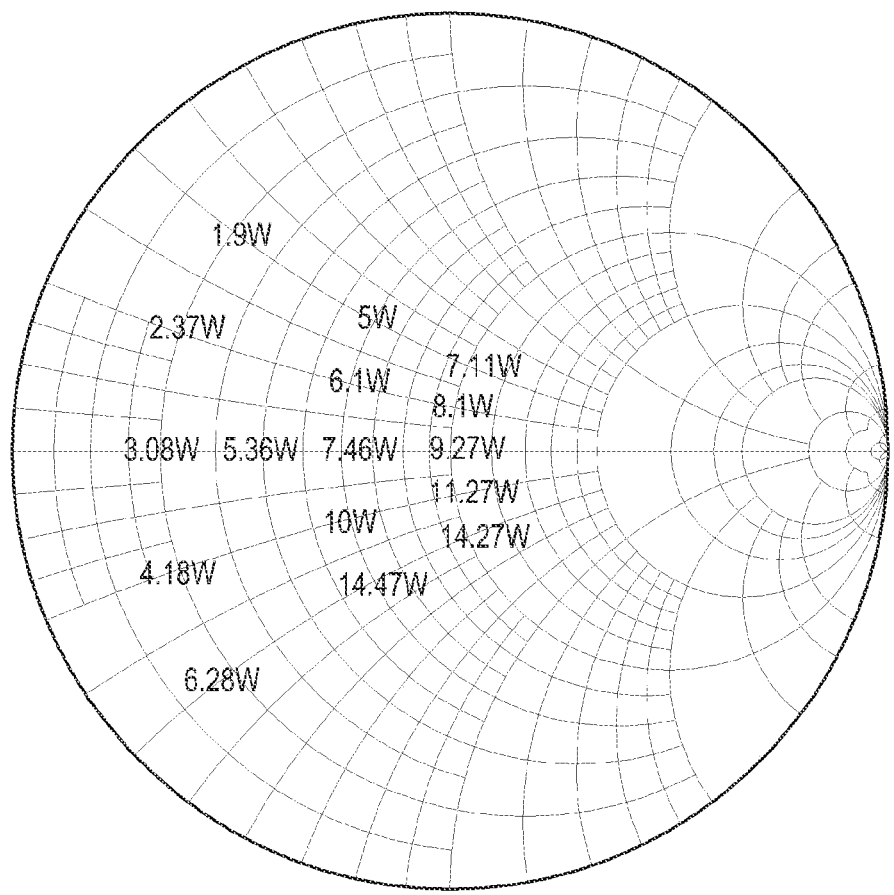
FIG. 9 is a Smith chart illustrating a change of the output electric power to a change of the load resistance in a class D type amplifier according to an embodiment of the present invention of FIG. 3A.

FIG. 9 is a Smith chart illustrating a change of the output electric power to a change of the load resistance in the class D type amplifier according to the embodiment of the present invention of FIG. 3A. As shown in FIG. 9, it is identified that the value of the output electric power decreases as the load resistance value decreases in a direction from an origination point of the Smith chart to the left.

Figure 10:
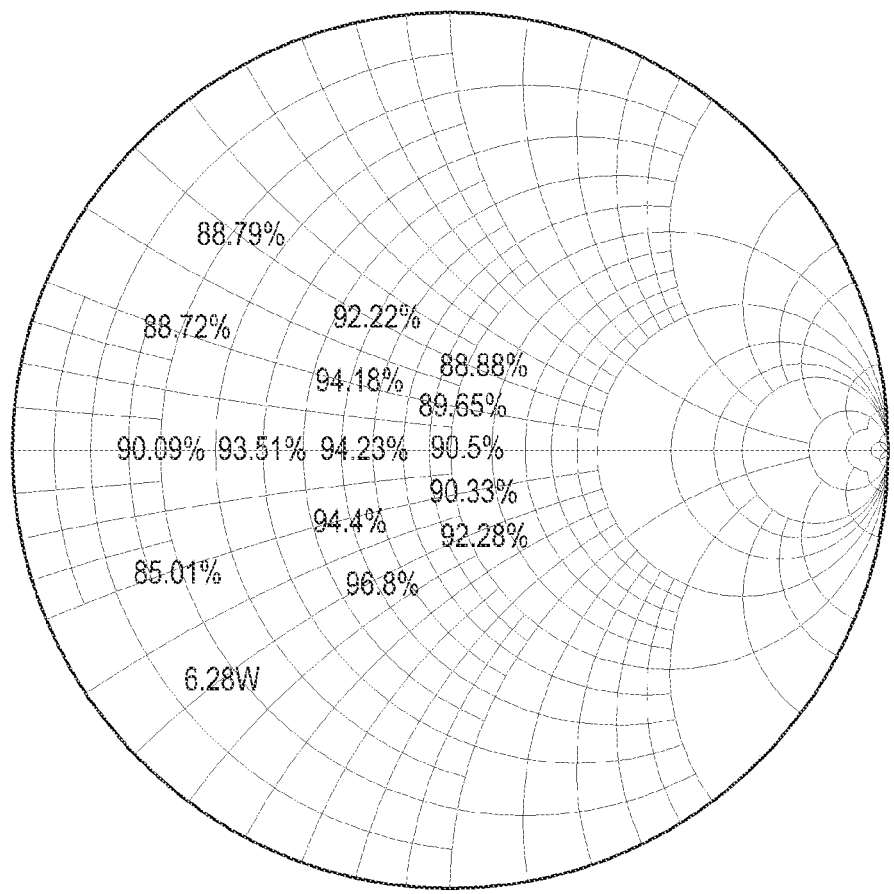
FIG. 10 is a Smith chart illustrating a change of the efficiency to a change of the load resistance in a class D type amplifier according to an embodiment of the present invention of FIG. 3A.

FIG. 10 is a Smith chart illustrating a change of the efficiency to a change of the load resistance in the class D type amplifier according to the embodiment of the present invention of FIG. 3A. As shown in FIG. 10, it is understood that a high efficiency of 90% is generally achieved.

While the present invention has been shown and described with reference to certain embodiments thereof, it will be understood by those skilled in the art that various changes in form and details may be made therein without departing from the spirit and scope of the present invention as defined by the appended claims. Therefore, various modified implementations can be made without departing from the substance of the present invention claimed in the appended claims, and the modified implementations should not be construed separately from the technical idea of the present invention.

What is claimed is:

1. A wireless power transmitter for transmitting power for charging a wireless power receiver, the wireless power transmitter comprising:
   an amplifier configured to amplify power and generate an alternating current (AC) power; and
   a transmitting coil configured to wirelessly transmit power based on the generated AC power,
   wherein the amplifier comprises:
   a first transistor of which a first end is connected to ground and a second transistor of which a first end is connected to ground;
   a capacitor of which a first end is connected to a second end of the first transistor, wherein a second end of the capacitor is connected to a second end of the second transistor, and the second end of the capacitor is connected to a first end of the transmitting coil; and
   a coil of which a first end is connected to the first end of the capacitor, wherein a second end of the coil is connected to a second end of the transmitting coil.

2. The wireless power transmitter as claimed in claim 1, wherein the amplifier is a class D type amplifier.

3. The wireless power transmitter as claimed in claim 1, wherein the amplifier further comprises an RF choke device, wherein a first end of the RF choke device is connected to the second end of the first transistor and a second end of the RF choke device is connected to the second end of the second transistor.

4. The wireless power transmitter as claimed in claim 3, wherein impedance in view of the second end of the first transistor and the second end of the second transistor is $$\frac{R_L}{R_L^2 + \omega^2 L^2} + j\left(\omega C - \frac{\omega L}{R_L^2 + \omega^2 L^2}\right),$$

RL is a resistance value corresponding to the transmitting coil and the wireless power receiver, $\omega$ is a frequency of the power, L is an inductance of the coil, and C is a capacitance of the capacitor.

5. The wireless power transmitter as claimed in claim 4, wherein the value of the power output from the amplifier is $$\frac{\pi^2}{2} \frac{V_{DD}^2}{\omega^2 L^2} R_L,$$

and VDD is a voltage value of the power.

6. The wireless power transmitter as claimed in claim 3, further comprising: a resonant filter which is connected to the second end of the first transistor, the second end of the second transistor and the one end of the coil, so as to filter a certain frequency.

7. A class D type amplifier, comprising:
   a first transistor of a which a first end is connected to ground, and a second transistor of which a first end is connected to ground;
   an RF choke device, wherein a first end of the RF choke device is connected to a second end of the first transistor;
   a capacitor of which a first end is connected to the second end of the first transistor, wherein a second end of the capacitor is connected to the second end of the second transistor, and the second end of the capacitor is connected to a first end of a transmitting coil, which receives an amplified power from the class D type amplifier and transmits magnetic power corresponding to the amplified power; and
   a coil of which a first end is connected to the first end of the capacitor, wherein a second end of the coil is connected to a second end of the transmitting coil.

* * * * *